United States Patent
Bernardi et al.

(10) Patent No.: US 7,149,844 B2
(45) Date of Patent: Dec. 12, 2006

(54) NON-VOLATILE MEMORY DEVICE

(75) Inventors: Oreste Bernardi, Bernareggio (IT);
Marco Redaelli, Carate Brianza (IT);
Corrado Villa, Sovico (IT)

(73) Assignee: STMicroelectronics S.R.L. (IT)

( * ) Notice: Subject to any disclaimer, the term of this patent is extended or adjusted under 35 U.S.C. 154(b) by 207 days.

(21) Appl. No.: 10/390,556

(22) Filed: Mar. 14, 2003

(65) Prior Publication Data

US 2003/0210585 A1    Nov. 13, 2003

(30) Foreign Application Priority Data

Mar. 14, 2002  (EP) ................................. 02425152

(51) Int. Cl.
*G06F 12/00*    (2006.01)
(52) U.S. Cl. .................. 711/103; 711/154; 711/155
(58) Field of Classification Search ................ 711/103, 711/102, 154, 155
See application file for complete search history.

(56) References Cited

U.S. PATENT DOCUMENTS

| | | | |
|---|---|---|---|
| 5,463,757 A | | 10/1995 | Fandrich et al. |
| 5,844,843 A | * | 12/1998 | Matsubara et al. ..... 365/185.24 |
| 5,937,423 A | * | 8/1999 | Robinson ..................... 711/103 |
| 6,240,019 B1 | | 5/2001 | Shiga et al. |
| 6,260,102 B1 | * | 7/2001 | Robinson ..................... 711/103 |
| 6,279,069 B1 | * | 8/2001 | Robinson et al. ........... 711/103 |

FOREIGN PATENT DOCUMENTS

| | | |
|---|---|---|
| FR | 2 719 939 | 11/1995 |
| WO | WO 98/28750 | 7/1998 |
| WO | WO 98/29876 * | 7/1998 |
| WO | WO 01/45106 A2 | 6/2001 |

OTHER PUBLICATIONS

European Search Report for EP 02 42 5152, dated Oct. 3, 2002.

* cited by examiner

*Primary Examiner*—T Nguyen
(74) *Attorney, Agent, or Firm*—Lisa K. Jorgenson; Bryan A. Santarelli; Graybeal Jackson Haley LLP

(57) ABSTRACT

A non-volatile memory device is proposed. The non-volatile memory device includes a flash memory and means for executing external commands, the external commands including a first subset of commands for accessing the flash memory directly; the memory device further includes a programmable logic unit and means for storing program code for the logic unit, the external commands including a second subset of at least one command for causing the logic unit to process information stored in at least one portion of the flash memory under the control of the program code.

23 Claims, 2 Drawing Sheets

NON-VOLATILE MEMORY DEVICE

PRIORITY CLAIM

This application claims priority from European patent application No. 02425152.2, filed Mar. 14, 2002, which is incorporated herein by reference.

TECHNICAL FIELD

The present invention relates generally to a non-volatile memory device.

BACKGROUND

Non-volatile memory devices store information, which must be preserved even when a power supply feeding the memory device is off. These memory devices are commonly used as external peripherals (by a processing unit) in several applications.

A particular type of non-volatile memory device is a flash $E^2PROM$ (or simply flash memory). A flash memory consists of a matrix of memory cells, each one formed by a single transistor. This results in a very simple structure of the flash memory, which can be manufactured at low cost and with high density. As a consequence, the flash memory is well suited to a number of end-product applications, such as mobile telephones, automotive devices, digital still cameras, hand-held computers, and the like.

A drawback of flash memories is that they must be erased in blocks. The smallest dimension of the block that can be used in practice at a reasonable cost amounts to a few kilobytes. However, the resolution so achieved is insufficient for several applications requiring the ability to modify information at the word, byte, or even bit level. As a consequence, complex Systems on Chips (SOCs) embedding both a flash memory and an $E^2PROM$ (which can be erased a bit at a time) are often required.

A different solution known in the art is that of using only the flash memory for storing both persistent information (such as program code) and information that needs to be updated (such as data). The data stored in the flash memory is managed by a software program, which controls and organizes the flash memory so as to emulate the behavior of an $E^2PROM$. The data management software is stored in the flash memory, and runs on the processing unit that employs the flash memory as an external peripheral; the flash memory has a multiple-bank architecture, so that instructions of the data management software may be fetched and executed from one bank while another bank is being programmed or erased. In this way, the capacity of the non-volatile memory device is increased (for the same cost) or its cost is reduced (for the same capacity).

A drawback of the solution described above is that the running of the data management software involves an overload of the processing unit; as a consequence, the performance of a whole system (including the flash memory and the processing unit) is reduced.

Moreover, a large amount of data must be transmitted (typically on a communication bus) between the flash memory and the processing unit. The high traffic on the communication bus increases the power consumption of the system. This drawback is particular acute in portable systems (such as mobile telephones), which are supplied by a battery.

SUMMARY

One embodiment of the present invention overcomes the above-mentioned drawbacks.

Briefly, this embodiment of the present invention provides a non-volatile memory device including a flash memory and means for executing external commands, the external commands including a first subset of commands for accessing the flash memory directly; the memory device further includes a programmable logic unit and means for storing program code for the logic unit, the external commands including a second subset of at least one command for causing the logic unit to process information stored in at least one portion of the flash memory under the control of the program code.

Moreover, an embodiment of the present invention also provides a data-processing system including the non-volatile memory device.

BRIEF DESCRIPTION OF THE DRAWINGS

Further features and advantages of the solutions according to the present invention will be made clear by the following description of a preferred embodiment thereof, given purely by way of a non-restrictive indication, with reference to the attached figures, in which.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention as defined by the appended claims. Thus, the present invention is not intended to be limited to the embodiments shown, but is to be accorded the widest scope consistent with the principles and features disclosed herein.

Figure 1:
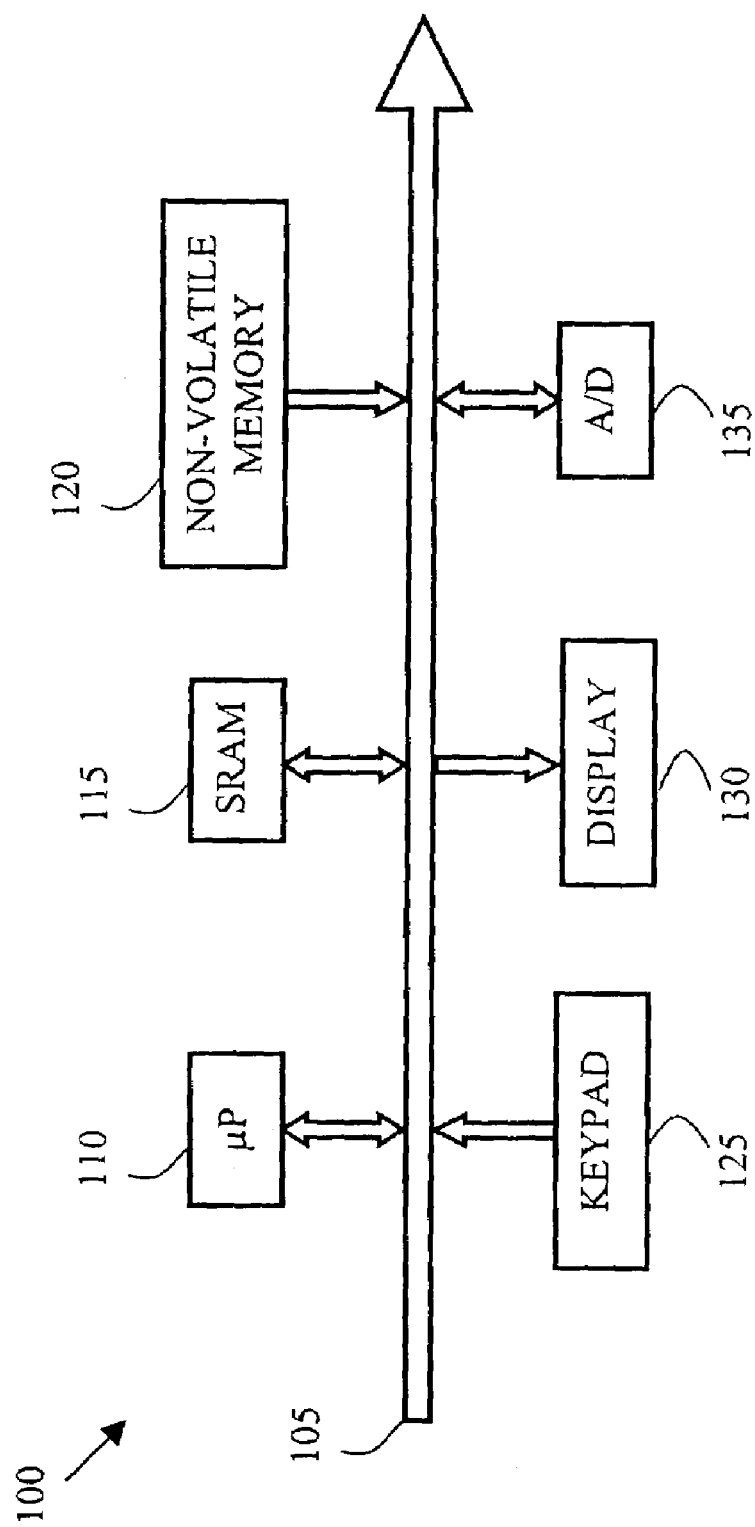
FIG. 1 is a schematic block diagram of a processing section of a mobile telephone in which a non-volatile memory device according to an embodiment of the invention can be used.

With reference in particular to FIG. 1, a processing section 100 of a mobile telephone is depicted. The processing section 100 is formed by several units, which are connected in parallel to a communication bus 105. In detail, a microprocessor (μP) 110 controls operation of the processing section 100, and a SRAM 115 is used directly by the microprocessor 110 as a working memory.

A non-volatile memory device 120 (described in the following) stores the program code executed by the microprocessor 110. Moreover, the non-volatile memory device 120 is used for storing data that needs to be preserved when a power supply feeding the processing section 100 is off. For example, the non-volatile memory device 120 stores a telephone book and the text of SMSs that have been sent and received by the mobile telephone.

Further peripheral units are connected to the bus 105 (by means of respective interfaces). Particularly, an input unit consists of a keypad 125 and an output unit consists of a display 130. Moreover, the processing section 100 includes an analog-to-digital (A/D) converter 135; the A/D converter 135 is used to interface the processing section 100 with external units, such as a Radio Frequency (or RF) section, a microphone, and a loudspeaker.

Similar considerations apply if the processing section 100 is used in different applications (for example, in a digital still camera, in a music player, in a hand-held computer or in a voice recorder), if the processing section has a different architecture or includes other units, if it is replaced with an equivalent data processing system, and the like.

Figure 2:
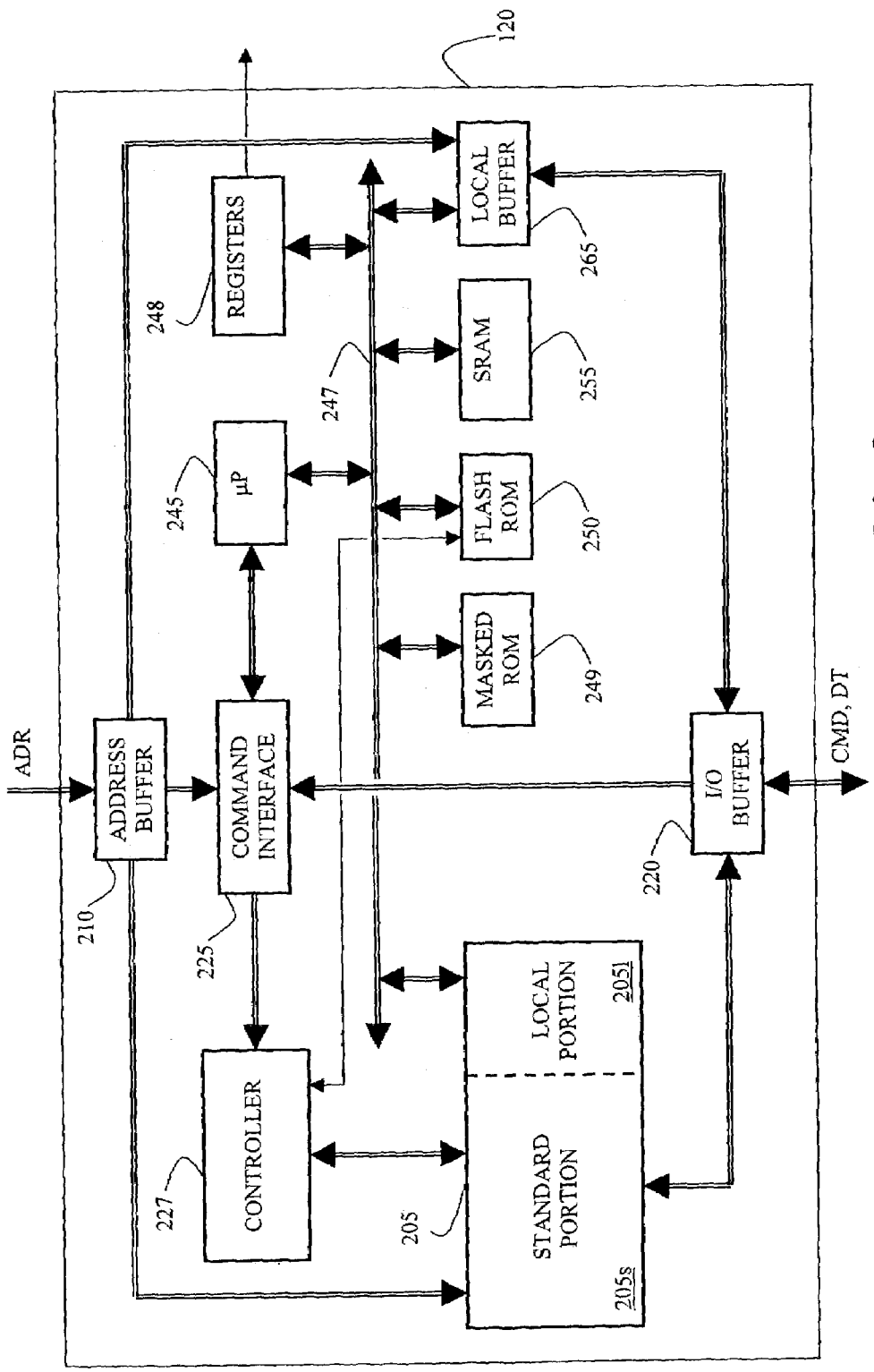
FIG. 2 shows a schematic block-diagram of the non-volatile memory device.

Considering now FIG. 2, the non-volatile memory device 120 is integrated in a single chip of semiconductor material according to an embodiment of the invention. The non-volatile memory device 120 includes a flash memory 205, which is formed by a matrix of memory cells (each one consisting of a floating gate MOS transistor). The flash memory 205 is partitioned into a plurality of banks made in respective insulated wells of the chip; for example, the flash memory 205 consists of 28 banks each one with 512 k memory cells. Each bank is formed by 8 blocks (or sectors) of 32 k memory cells; all the memory cells of a block must be erased at the same time (with each block that may be erased individually).

A word (typically of 16 bits) is simultaneously processed by the flash memory 205. The flash memory 205 has a multiple-bank architecture, which provides a dual operations feature. In this way, while programming or erasing in one bank, read operations are possible in another bank with zero latency (only one bank at a time is allowed to be in program or erase mode); if a read operation is required in a bank that is being programmed or erased, the program or erase operation is suspended. The combination of these features means that read operations on the flash memory are possible at any time.

The flash memory 205 is logically partitioned into a standard portion 205s and a local portion 205l (each one consisting of one or more different banks). The standard portion 205s stores persistent information (such as program code), while the local portion 205l stores information that needs to be updated (such as data). The dual operations feature of the flash memory 205: allows the program code to be executed from the standard portion 205s while the local portion 205l is programmed or erased.

An address buffer 210 is used as an input structure for receiving an external address ADR, which identifies a location of the flash memory 205 storing a word. In the example at issue, the flash memory 205 is formed by 128 banks each one with 512 k memory cells, that is 512/16=32 k words of 16 bits; the flash memory 205 then stores $128 \cdot 32 \cdot 1024 = 2^7 \cdot 2^5 \cdot 2^{10} = 2^{22}$ words; as a consequence, each location of the flash memory 205 is identified by an address ADR of 22 bits. Moreover, an I/O buffer 220 receives information from the microprocessor (such as the microprocessor 110 of FIG. 1) external to the non-volatile memory device 120; the information consists either of external commands CMD for the non-volatile memory device 120 or data DT to be written into the flash memory 205; the I/O buffer 220 is further used to provide data DT read from the flash memory 205 to the external microprocessor.

The address ADR from the buffer 210 and the data DT from the buffer 220 are supplied to the flash memory 205 directly. The address buffer 210 and the I/O buffer 220 are further coupled with a command interface 225. The command interface 225 interprets the commands CMD received from the I/O buffer 220. The command interface 225 accordingly actuates a controller 227, which is typically implemented with a state machine; the state machine 227 provides a sequence of control signals causing the flash memory 205 to execute the operations required by each command CMD.

The command interface 225 also communicates with a microprocessor (μP) 245 embedded in the non-volatile memory device 120. Several units are connected in parallel to the embedded microprocessor 245 through a communication bus 247. In detail, a series of high-speed internal registers 248 stores information that is used by the embedded microprocessor 245 directly. Particularly, one register 248 is used to store status information, indicative of an operative condition of the non-volatile memory device 120, and another register 248 is used to store configuration information, indicative of the dimensions of the standard portion 205s and of the local portion 205l of the flash memory; the status register and the configuration register are accessible from the outside of the non-volatile memory device 120 directly.

A masked ROM 249 is hardwired with preprogrammed instructions for the embedded microprocessor 245. A further ROM 250 (typically implemented with a small flash memory) stores program code controlling operation of the embedded microprocessor 245, which program code is loaded from the outside under the control of the state machine 227. A SRAM 255 (for example, storing 8 k words) is used directly by the embedded microprocessor 245 as a working memory.

The embedded microprocessor 245 is further coupled with the local portion 205l of the flash memory and with a local buffer 265 (implemented with a volatile memory, such as a SRAM storing 1 k words); the local buffer 265 is directly mapped on the same address space of the lowest area of the local portion 205l. The local buffer 265 is input a portion of the address ADR from the buffer 210; particularly, the local buffer 265 receives the 10 least significant bits of the address ADR, which are required to identify one of its $1 k=2^{10}$ locations. The local buffer 265 is coupled with the I/O buffer 220, in order to receive words to be written into the local buffer 265 and control signals for managing its operation; the I/O buffer 220 is further used to provide a word read from the local buffer 265 to the external microprocessor.

The command interface 225 supports the most common commands of a standard flash memory. Particularly, a Word Program command and a Word Read command are used to program and to read, respectively, a selected location of the flash memory 205, a Block Erase command is used to erase a specific block of the flash memory 205, an Autoselect command is used to read a manufacturer code and a device code identifying the flash memory 205, a Read CFI command is used to read a Command Flash Interface defining the specifications of the flash memory 205, and the like.

Moreover, the command interface 225 supports additional commands. Particularly, a Start command and a Suspend command are used to start and to suspend, respectively, operation of the embedded microprocessor 245. A Reset command forces a hardware reset of the embedded microprocessor 245. A Read/Write Buffer command is used to switch the non-volatile memory device 120 to a local mode of operation, wherein the external microprocessor can access the local buffer 265 (temporarily mapped on the address space of the local portion 205l of the flash memory); a Read Flash command is used to switch the non-volatile memory device 120 back to a standard mode of operation wherein the external microprocessor accesses the whole flash memory 205 (assuming that the embedded microprocessor 245 is idle). A Code Erase command and a Code Program command are used to erase and to program, respectively, the flash ROM 250 (in order to update the program code stored therein). Finally, a Configuration command updates the content of the configuration register.

The non-volatile memory device 120 described above is used as a standard flash memory by the external microprocessor. Particularly, assuming that the non-volatile memory device 120 is in the standard mode of operation (local buffer

265 non-accessible from the outside), the external microprocessor accesses the whole flash memory 205 (both the standard portion 205s and the local portion 205l) as usual.

Whenever the external microprocessor needs to perform generic data management operations involving the content of the local portion 205l of the flash memory, a Read/Write Buffer command is sent to the non-volatile memory device 120. In response thereto, the non-volatile memory device 120 is switched to the local mode of operation (making the local buffer 265 accessible from the outside).

One or more words are then written into the local buffer 265; each word is written into the location identified by the address ADR during a writing cycle, which is managed through corresponding control signals provided by the external microprocessor directly. In this way, the external microprocessor downloads information to the non-volatile memory device 120; the information consists of instructions (defining data management operations to be carried out by the embedded microprocessor 245) and possible corresponding data.

Once downloading of the information is completed, the external microprocessor sends a Start command to the non-volatile memory device 120. In response thereto, the embedded microprocessor 245 is started and the program code stored in the flash ROM 250 is run. The program code interprets the instructions loaded in the local buffer 265. These instructions will cause the embedded microprocessor 245 to carry out corresponding operations on the data stored in the local buffer 265 and/or in the local portion 205l of the flash memory; for example, the data downloaded to the local buffer 265 is saved (either directly or after being processed by the embedded microprocessor 245) in the local portion 205l, or selected data is retrieved from the local portion 205l, processed by the embedded microprocessor 245 if necessary, and then stored into the local buffer 265.

As soon as processing is completed, the embedded microprocessor 245 updates the status register accordingly. The status register is periodically polled by the external microprocessor. When the external microprocessor detects completion of the processing, the external microprocessor reads the result of the processing stored in the local buffer 265 if necessary. Particularly, each word in the location of the local buffer 265 identified by the address ADR is read during a reading cycle, which is managed through corresponding control signals provided by the external microprocessor directly.

Meanwhile, the external microprocessor is always allowed to access the standard portion 205s of the flash memory as usual. Moreover, if the external microprocessor needs to access the local portion 205l of the flash memory a Suspend command is sent to the non-volatile memory device 120. In response thereto, operation of the embedded microprocessor 245 is suspended (storing its current condition into the SRAM 255), and the status register is updated accordingly. The external microprocessor then sends a Word Read command to the non-volatile memory device 120, in order to read the words stored in the selected locations of the local portion 205l of the flash memory. Once reading of the local portion 205l of the flash memory has been completed, the external microprocessor sends a Resume command to the non-volatile memory device 120. In response thereto, operation of the embedded microprocessor 245 is resumed (after retrieving the stored condition from the SRAM 255), and the status register is restored accordingly.

In addition, the external microprocessor may force a hardware reset of the embedded microprocessor 245 by sending a Reset command to the non-volatile memory device 120. This command will cause operation of the embedded microprocessor to be aborted (with the status register that is updated accordingly).

The proposed architecture is used in different applications. For example, when the external microprocessor needs to update the content of the non-volatile device 120 the new data is downloaded to the local buffer 265; the local portion 205l of the flash memory is then updated accordingly under the control of the embedded microprocessor 245. Preferably, the embedded microprocessor manages a look-up table (stored in the SRAM 255), which defines a directory of the local portion 205l of the flash memory. In this way, the embedded microprocessor 245 emulates the behavior of a direct access bulk memory (such as a hard-disk).

Alternatively, the non-volatile memory device 120 is used to store compressed data. In this case, the (original) data is downloaded to the local buffer 265; the embedded microprocessor 245 directly controls compression of the data and its storing into the local portion 205l of the flash memory. Whenever the original data is required by the external microprocessor, the data is de-compressed by the embedded microprocessor 245 and stored into the local buffer 265. The original data is then read from the local buffer 265 by the external microprocessor directly.

Similar considerations apply if the non-volatile memory device includes equivalent functional units, if the flash memory, the local buffer and/or the SRAM have a different capacity, if the embedded microprocessor is replaced with an equivalent programmable logic unit, if the status register and/or the configuration register are placed elsewhere, if the local buffer is implemented with equivalent means, if the standard portion and the local portion of the flash memory are configured in a different way, if a chip enable pin is used to actuates the local buffer (instead of the Read/Write Buffer command), if the status of the embedded microprocessor is monitored by hardware (for example, using a busy pin of the non-volatile memory device), if the non-volatile memory device supports other commands, if further functions are provided (for example, for preventing execution of conflicting operations on the flash memory). Alternatively, the local portion of the flash memory is used for different applications; for example, the embedded microprocessor controls encoding/decoding or ciphering/deciphering of data stored in the non-volatile memory device, the embedded microprocessor implements error correction procedures on the data stored in the flash memory, and the like.

More generally, an embodiment of the present invention proposes a non-volatile memory device including a flash memory. Means are provided for executing external commands; the external commands include a first subset of commands for accessing the flash memory directly. The memory device further includes a programmable logic unit and means for storing program code for the logic unit. The external commands includes a second subset of one or more commands for causing the logic unit to process information stored in at least one portion of the flash memory under the control of the program code.

The proposed architecture reduces the overload of any external processing unit employing the non-volatile memory device as a peripheral; in fact, most of the data management processing is carried out by the embedded microprocessor directly. In this way, the performance of a whole system (wherein the non-volatile memory device is included) is strongly increased.

This reduces the amount of data that must be transmitted between the non-volatile memory device and the external microprocessor. Such a non-volatile memory device is particularly advantageous in portable systems that are supplied by a battery (such as mobile telephones), even if the use of the devised structure in different applications is not excluded.

In addition, any data management software already available for controlling and organizing the flash memory may be reused, and downloaded to the non-volatile memory device at production time.

The preferred embodiment of the invention described above offers further advantages.

Particularly, the non-volatile memory device includes a local buffer that is mapped on the local portion of the flash memory; the local buffer is directly accessible from the external microprocessor in the local mode of operation of the non-volatile memory device.

The proposed feature makes it possible to download information for the embedded microprocessor and to upload any result of the processing in a very simple manner.

Preferably, the flash memory is logically partitioned into a standard portion and a local portion (for the embedded microprocessor).

This feature ensures that the embedded microprocessor only accesses a dedicated portion of the flash memory.

Advantageously, the dimensions of the two portions of the flash memory are updated dynamically.

In this way, the flash memory may be configured for different conditions of use.

Alternatively, information is downloaded to and/or uploaded from the non-volatile memory device with another procedure (for example, only using the I/O buffer), the flash memory is partitioned in a different manner, the dimensions of the standard portion and of the local portion cannot be updated dynamically, the embedded microprocessor is allowed to access the whole flash memory, and the like.

As a further improvement, the program code controlling operation of the embedded microprocessor interprets instructions that have been loaded into the local buffer.

In this way, a number of operations may be requested to the embedded microprocessor employing a single command (for starting its operation).

Preferably, the non-volatile memory device supports two commands for suspending and for resuming, respectively, operation of the embedded microprocessor.

These commands allow the local portion of the flash memory to be accessed at all times.

Moreover, the non-volatile memory device includes means for providing an indication of the conclusion of the processing operations.

This feature makes it possible to synchronize operation of the embedded microprocessor and of the external microprocessor.

However, other embodiments of the present invention may implement the controlling operation of the embedded microprocessor in a different way, without any suspend and/or resume command, and even monitoring the processing operations in a different way.

In a preferred embodiment of the invention, the flash memory has a multiple-bank architecture.

In this way, program code stored in the standard portion can be always read while updating data stored in the local portion.

Advantageously, the non-volatile memory device according to an embodiment of the invention is integrated in a single chip of semiconductor material.

The proposed structure provides very high performance.

However, the non-volatile memory device according to an embodiment of the invention is also suitable to be implemented with a different flash memory, or even distributing the components of the non-volatile memory device across two or more chips (but with the device that is always seen as a single peripheral from the outside).

Naturally, in order to satisfy local and specific requirements, a person skilled in the art may apply to the solution described above many modifications and alterations all of which, however, are included within the scope of protection of the invention.

What is claimed is:

1. A non-volatile memory device including a flash memory and means for executing external commands, the external commands including a first subset of commands for allowing direct access to the flash memory by a device external to the memory device,
   wherein
   the memory device further includes a programmable logic unit and means for storing program code for the logic unit, the external commands including a second subset of at least one command for causing the logic unit to process information stored in at least one portion of the flash memory under the control of the program code.

2. The memory device according to claim 1, wherein the at least one portion of the flash memory is mapped on a corresponding address space, the memory device further including buffering means mapped on said address space and means for switching the memory device between a first operative condition and a second operative condition, the buffering means being non-accessible from the outside in the first operative condition and the buffering means being directly accessible from the outside instead of the at least one portion of the flash memory in the second operative condition.

3. The memory device according to claim 1, further including means for logically partitioning the flash memory into a first and a second portion, the at least one portion of the flash memory including the second portion.

4. The memory device according to claim 3, further including means for dynamically updating the dimensions of the first and the second portion of the flash memory.

5. The memory device according to claim 3, wherein the information stored in the buffering means includes instructions for causing the program code to execute corresponding processing operations on the information stored in the second portion of the flash memory, the second subset including a command for starting operation of the logic unit.

6. The memory device according to claim 5 wherein the second subset further includes a command for suspending operation of the logic unit and a command for resuming operation of the logic unit.

7. The memory device according to claim 5, further including means for providing an indication of the conclusion of the processing operations.

8. The memory device according to claim 1, wherein the flash memory has a multiple-bank architecture.

9. The memory device according to claim 1, wherein the memory device is integrated in a single chip of semiconductor material.

10. A data processing system including the memory device of claim 1.

11. An integrated memory circuit, comprising:
   a nonvolatile memory having first and second sections;
   an external data bus coupled to the nonvolatile memory;
   a processor coupled to the nonvolatile memory; and
   a controller coupled to the nonvolatile memory and operable to cause the first and second sections to communicate with the external data bus independently of the processor in a first mode of operation and to cause the second section to communicate with the external data bus via the processor in a second mode of operation.

12. The memory circuit of claim 11, further comprising:
an internal bus coupled to the processor and to the second section of the nonvolatile memory; and
wherein the second section is operable to communicate with the processor via the internal bus during the second mode of operation.

13. The memory circuit of claim 11, further comprising:
a program memory operable to store a program; and
wherein the processor is coupled to the program memory and is operable to execute the program during the second mode of operation.

14. The memory circuit of claim 11 wherein:
the external data bus is operable to receive commands; and
the controller is operable to control operation of the nonvolatile memory in response to the received commands.

15. The memory circuit of claim 11, further comprising:
a buffer coupled to the processor and to the external data bus;
wherein the processor is operable to process data from the second section of the nonvolatile memory and to store the processed data in the buffer; and
wherein the processor is operable to process data from the buffer and store the processed data in the second section of the nonvolatile memory.

16. The memory circuit of claim 11, further comprising:
wherein the second section of the nonvolatile, memory includes a first set of storage locations mapped to an address range; and
a buffer coupled to the processor and to the external data bus and including a second set of storage locations mapped to the address range.

17. The memory circuit of claim 11, further comprising:
wherein the first and second sections of the nonvolatile memory have respective sizes; and
a configuration circuit coupled to the nonvolatile memory and operable to select the sizes of the first and second sections.

18. An electronic system, comprising:
an external processor; and
a memory circuit coupled to the external processor, operable in first and second modes, and comprising,
a nonvolatile memory having first and second sections,
an internal processor coupled to the nonvolatile memory, and
a controller coupled to the nonvolatile memory and operable to cause the first and second sections to communicate with the external processor independently of the internal processor in the first mode of operation and to cause the second section to communicate with the external processor via the internal processor in the second mode of operation.

19. The system of claim 18 wherein the external processor is operable to select the operational mode of the memory circuit.

20. The system of claim 18 wherein the external processor is operable to configure the sizes of the first and second sections of the nonvolatile memory.

21. A method, comprising:
during a first mode of operation, accessing first and second sections of a nonvolatile memory disposed in a monolithic memory circuit independently of an internal processor disposed in the monolithic memory circuit; and
during a second mode of operation, accessing the second section of the nonvolatile memory via the internal processor.

22. The method of claim 21 wherein accessing the second section during the second mode of operation comprises:
storing data in a buffer;
processing the stored data with the internal processor according to a program stored on the monolithic memory circuit; and
storing the processed data in the second section of the nonvolatile memory.

23. The method of claim 21 wherein accessing the second section during the second mode of operation comprises:
reading data from the second section of the nonvolatile memory with the internal processor;
processing the retrieved data with the internal processor according to a program stored on the monolithic memory circuit;
storing the processed data in the buffer; and
reading the processed data from the buffer with a device that is external to the monolithic memory circuit.

* * * * *